(12) United States Patent
Matsudai et al.

(10) Patent No.: US 8,159,036 B2
(45) Date of Patent: Apr. 17, 2012

(54) SEMICONDUCTOR DEVICE AND METHOD OF MANUFACTURING THE SAME

(75) Inventors: Tomoko Matsudai, Tokyo (JP); Norio Yasuhara, Kawasaki (JP); Manji Obatake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 661 days.

(21) Appl. No.: 12/141,386

(22) Filed: Jun. 18, 2008

(65) Prior Publication Data

US 2008/0315305 A1 Dec. 25, 2008

(30) Foreign Application Priority Data

Jun. 20, 2007 (JP) ................... 2007-162642

(51) Int. Cl.
*H01L 21/02* (2006.01)
(52) U.S. Cl. .............. 257/408; 257/336; 257/344
(58) Field of Classification Search .......... 257/336, 257/344, 408
See application file for complete search history.

(56) References Cited

U.S. PATENT DOCUMENTS

| 7,235,451 | B2 | 6/2007 | Hao et al. |
| 7,304,348 | B2 | 12/2007 | Ehwald et al. |
| 7,449,753 | B2 * | 11/2008 | Wang et al. ............. 257/369 |
| 2005/0098845 | A1 | 5/2005 | Matsudai et al. |
| 2006/0011981 | A1 | 1/2006 | Lee |
| 2006/0097292 | A1 | 5/2006 | Nakamura et al. |
| 2007/0034985 | A1 | 2/2007 | Matsudai et al. |
| 2007/0040216 | A1 | 2/2007 | Matsudai et al. |
| 2007/0126067 | A1 * | 6/2007 | Hattendorf et al. ........... 257/412 |
| 2008/0006886 | A1 * | 1/2008 | Mehta et al. .................. 257/401 |
| 2008/0029830 | A1 * | 2/2008 | Tsai et al. ..................... 257/408 |
| 2008/0224210 | A1 * | 9/2008 | Cai .............................. 257/338 |
| 2008/0258215 | A1 * | 10/2008 | Tornblad et al. .............. 257/343 |

FOREIGN PATENT DOCUMENTS

| JP | 3-270139 | 12/1991 |
| JP | 6-13401 | 1/1994 |
| JP | 7-183498 | 7/1995 |

(Continued)

OTHER PUBLICATIONS

Eiji Yanokura, et al., "A 1.5GHz, 35-W Si-MOSFET with an Internal Matching Circuit", Proc. of the $6^{th}$ Internat. Symposium on Power Semiconductor Devices & IC's, May 31, 1994, pp. 425-429.

(Continued)

*Primary Examiner* — N Drew Richards
*Assistant Examiner* — Jae Lee
(74) *Attorney, Agent, or Firm* — Oblon, Spivak, McClelland, Maier & Neustadt, L.L.P.

(57) ABSTRACT

A LDD layer of the second conduction type locates in the surface of a semiconductor layer beneath a sidewall insulator film. A source layer of the second conduction type is formed in the surface of the semiconductor layer at a position adjacent to the LDD layer. A resurf layer of the second conduction type is formed in the surface of the semiconductor layer at a position sandwiching the gate electrode with the LDD layer. A drain layer of the second conduction type is formed in the surface of the semiconductor layer at a position adjacent to the resurf layer. The resurf layer is formed in depth to have peaks of a first and a second impurity concentration in turn from the surface of the semiconductor layer. The peak of the first impurity concentration is smaller than the peak of the second impurity concentration.

6 Claims, 7 Drawing Sheets

FOREIGN PATENT DOCUMENTS

| | | |
|---|---|---|
| JP | 9-162393 | 6/1997 |
| JP | 2005-116892 | 4/2005 |

OTHER PUBLICATIONS

Eiji Yanokura, et al., "A 1.5 GHz, 34-W Si-MOSFET with an Internal Matching Circuit", Proc. of the 6th Internat. Symposium on Power Semiconductor Devices & IC's, Cat. No. 94CH3377-9, Session 10, May 31-Jun. 2, 1994, pp. 425-429.

Jozef C. Mitros, et al., "High-Voltage Drain Extended MOS Transistors for 0.18-Ξm Logic CMOS Process", IEEE Transactions on Electron Devices, vol. 48, No. 8, Aug, 2001, pp. 1751-1755.

* cited by examiner

SEMICONDUCTOR DEVICE AND METHOD OF MANUFACTURING THE SAME

CROSS-REFERENCE TO RELATED APPLICATION

This application is based upon and claims the benefit of priority from prior Japanese Patent Application No. 2007-162642, filed on Jun. 20, 2007, the entire contents of which are incorporated herein by reference.

BACKGROUND OF THE INVENTION

1. Field of the Invention

The present invention relates to a semiconductor device, and more particularly to a structure of a lateral MOSFET and a method of manufacturing the same.

2. Description of the Related Art

Power MOSFETs include a LDMOS (Lateral Double diffused MOS) transistor as well known. The LDMOS transistor has a lower on-resistance and a smaller parasitic capacity and accordingly is hopeful as a low-breakdown voltage power device used for a synchronous rectifier.

A middle- or high-breakdown voltage LDMOS transistor of the conventional art depletes a drift region (resurf layer) formed in a region between a gate and a drain layer to retain the lateral breakdown voltage. The LDMOS is supplied with a gate drive voltage lower than the device breakdown voltage in many cases. though, on the application of a reverse bias, the drift region is depleted and accordingly a high voltage is never applied to the gate oxide film.

On the contrary, in a lower-breakdown voltage device with a drift region designed shorter, the device breakdown voltage can be retained without completely depleting the drift region. Therefore, on the application of a reverse bias, most of the reverse bias voltage is applied across the gate and the drift region, and a voltage higher than the gate drive voltage may be applied to the gate oxide film possibly. A CMOS has no such problem because the device breakdown voltage is designed equal to the gate drive voltage.

In recent years, fine patterning processes and fine patterning design rules similar to those for CMOS transistors, such as a 0.35 µm-rule and a 0.15 µm-rule, have been increasingly applied also to the LDMOS transistors. The application of the fine patterning design rule makes it possible to realize a short-channel LDMOS transistor and design a low-voltage driven LDMOS transistor. In such the case, a circuitry design can be realized for combining fine-patterned CMOS transistors with LDMOS transistors.

On the other hand, as regions are patterned finer, a mask misalignment greatly influences. The fine patterning process includes execution of a corresponding high-precision mask alignment though it is impossible to eliminate the mask misalignment completely. Therefore, a much finer patterning design may enlarge the region influenced by the mask alignment precision such as the estimation of a design margin.

As described above, the drift region in the LDMOS transistor is a region that most influences on the device breakdown voltage. In the case of a drift length of several µm, the mask misalignment influences less. In a design for a low breakdown voltage such as a breakdown voltage of around 5 V, the drift length is made extremely short such as 0.1-0.2 µm, which is greatly influenced by the mask misalignment. Thus, there is devised a method of implanting ions separately into the drift region with a mask of a sidewall having a width of 0.1-0.2 µm around the gate electrode (for example, JP 2005-116892A).

In the LDMOS transistor having the gate supplied with the drive voltage set lower than the source-drain breakdown voltage as described above, however, a higher dose to the drift region allows the electric field to concentrate between the gate and the drift layer on the application of a reverse voltage across source-drain. In this case, the voltage across the gate end and the drift layer exceeds the gate drive voltage and may possibly destruct the gate and cause a loss of the device reliability.

SUMMARY OF THE INVENTION

In an aspect the present invention provides a semiconductor device, comprising: a semiconductor layer of a first conduction type; a gate electrode formed on said semiconductor layer via an insulator layer; a sidewall insulator film formed on sides of said gate electrode; an LDD layer of a second conduction type located in the surface of said semiconductor layer beneath said sidewall insulator film; a source layer of the second conduction type formed in the surface of said semiconductor layer at a position adjacent to said LDD layer; a resurf layer of the second conduction type formed in the surface of said semiconductor layer at a position sandwiching said gate electrode with said LDD layer; and a drain layer of the second conduction type formed in the surface of said semiconductor layer at a position adjacent to said resurf layer, wherein said resurf layer is formed in depth to have peaks of a first and a second impurity concentration in turn from the surface of said semiconductor layer, wherein said peak of said first impurity concentration is smaller than said peak of said second impurity concentration.

In another aspect the present invention provides a method of manufacturing a semiconductor device, comprising: forming a gate electrode on a semiconductor layer of a first conduction type via a first insulator film formed thereon; forming an LDD layer of a second conduction type through ion implantation at one of positions sandwiching said gate electrode; forming a resurf layer of the second conduction type at a certain impurity concentration through ion implantation at the other of positions sandwiching said gate electrode; depositing a second insulator film over said substrate; applying a dry etching to remove said second insulator and form a sidewall on sides of said gate electrode; applying ion implantation with a mask of said sidewall to form a source layer and a drain layer adjacent to said LDD layer and said resurf layer, respectively; forming a source electrode connected to said source layer and a drain electrode connected to said drain layer, wherein the step of forming a resurf layer includes forming a resurf layer in depth to have peaks of a first and a second impurity concentration in turn from the surface of said semiconductor layer by varying the acceleration voltage for ion implantation, wherein said peak of said first impurity concentration is smaller than said peak of said second impurity concentration.

DETAILED DESCRIPTION OF THE EMBODIMENTS

The embodiments associated with the semiconductor device according to the present invention will now be described with reference to the drawings.

First Embodiment

Figure 1:
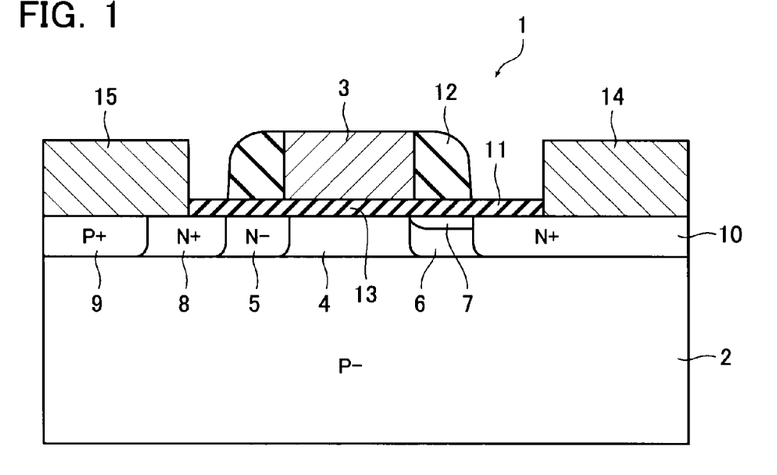
FIG. 1 briefly shows a structural cross-sectional view of a semiconductor device of a first embodiment according to the present invention.

FIG. 1 briefly shows a structural cross-sectional view of a LDMOS transistor according to the present embodiment. In the present embodiment, an N-type LDMOS transistor is described by way of example.

The LDMOS transistor 1 is formed in a high-resistance $P^-$-type semiconductor layer 2. The $P^-$-type semiconductor layer 2 may be either a $P^-$-type substrate or a P-type well layer formed in the substrate. The LDMOS transistor 1 has a gate electrode 3 selectively formed on the $P^-$-type semiconductor layer 2 with an insulator film 11 interposed therebetween. In the $P^-$-type semiconductor layer beneath the gate electrode 3, a P-type semiconductor layer or channel region 4 is formed. The channel region 4 forms an inverted layer when a drive voltage higher than the threshold voltage is applied to the gate electrode 3. On the left side (source side) of the channel region 4, a low-concentration $N^-$-type diffused layer or LDD layer 5 is formed. The LDD layer 5 is formed with an impurity doped at a lower concentration than a later-described source layer 8. On the right side (drain side) of the channel region 4, that is, at a position sandwiching the gate electrode 3 with the LDD layer 5, resurf layers (drift regions) 6, 7 having different impurity concentration peaks in depth are formed. In the present embodiment, for consideration of description, the resurf layers are formed in a double-layered structure though the two resurf layers merely differ in impurity concentration peak value. Hereinafter, for convenience's sake, they are referred to as the first resurf layer 6 and the second resurf layer 7 in the following description.

In depth, the first resurf layer (high concentration layer) 6 is formed in a deeper position than the second resurf layer 7. The first resurf layer 6 has the same conduction type ($N^-$-type) as the LDD layer 5. In depth, the second resurf layer (low concentration layer) 7 is formed in a shallower position than the first resurf layer 6.

The second resurf layer 7 has the same conduction type ($N^{--}$-type) as the first resurf layer 6 and is formed with an impurity doped at a lower concentration than the first resurf layer 6 as described later in detail. The resurf layers 6, 7 have a lateral length of 0.1-0.2 μm in accordance with the width of a sidewall 12 as described later in detail.

On the lateral far side of the LDD layer 5 from the gate electrode 3, a high-concentration $N^+$-type diffused layer or source layer 8 is formed with an impurity doped at a higher concentration. On the lateral far side of the source layer 8 from the LDD layer 5, a high-concentration $P^+$-type diffused layer or contact layer 9 is formed with an impurity doped at a higher concentration. On the lateral far side of the resurf layers 6, 7 from the gate electrode 3, a high-concentration $N^+$-type diffused layer or drain layer 10 is formed with an impurity doped at a higher concentration.

The insulator film 11 may be formed of a silicon oxide. A portion of the insulator film 11 formed below the gate electrode 3 configures a gate oxide film 13 in the MOSFET. The gate oxide film 13 is designed thinner in many cases than a CMOS transistor having almost the same breakdown voltage if the LDMOS transistor 1 is of the low breakdown voltage type. On sides of the gate electrode, a sidewall 12 is formed. As described below in detail, the sidewall 12 may include a silicon oxide, a silicon nitride and a silicon oxide deposited in turn. The insulator film 11 has contact holes selectively opened therethrough and a source electrode 15 and a drain electrode 14 are formed in the apertures. The drain electrode 14 is connected to the drain layer 10 and the source electrode 15 is connected to the source layer 8 and the contact layer 9 in common.

The following detailed description is given to the resurf layers 6, 7 in the LDMOS transistor 1 according to the present embodiment. In the present embodiment, the resurf layers 6, 7 include the first resurf layer 6 and the second resurf layer 7 having different concentration peaks. As described above, the LDMOS transistor 1 is a high-speed switching device with a low parasitic capacity, low power, and a low on-resistance. For example, in the case of an LDMOS device with a gate drive voltage of 1.5 V, the application of a voltage of 5 V to the drain electrode 14 causes a reverse bias of 5 V applied between a gate and a drain. In a low-breakdown voltage LDMOS transistor of the conventional art, the resurf layer is completely depleted to ensure the breakdown voltage. Therefore, the lateral length of the resurf layer is extended in accordance with the breakdown voltage to ensure a desired breakdown voltage, and a lowered impurity dose (for example, around $10^{12}$ $cm^{-2}$) is required to achieve an appropriate depletion.

On the other hand, in the case of a low-breakdown voltage LDMOS such as a 5 V LDMOS, a sufficient lateral length of the resurf layer is around 0.1-0.2 μm. Further, the device breakdown voltage can be retained without completely depleting the resurf layer. In the structure capable of retaining the breakdown voltage without depleting the resurf layer, however, when a reverse bias is applied, most of the reverse bias voltage is applied to the gate oxide film. If it exceeds the gate drive voltage, the reliability of the gate oxide film cannot be guaranteed as a problem.

Figure 2A:
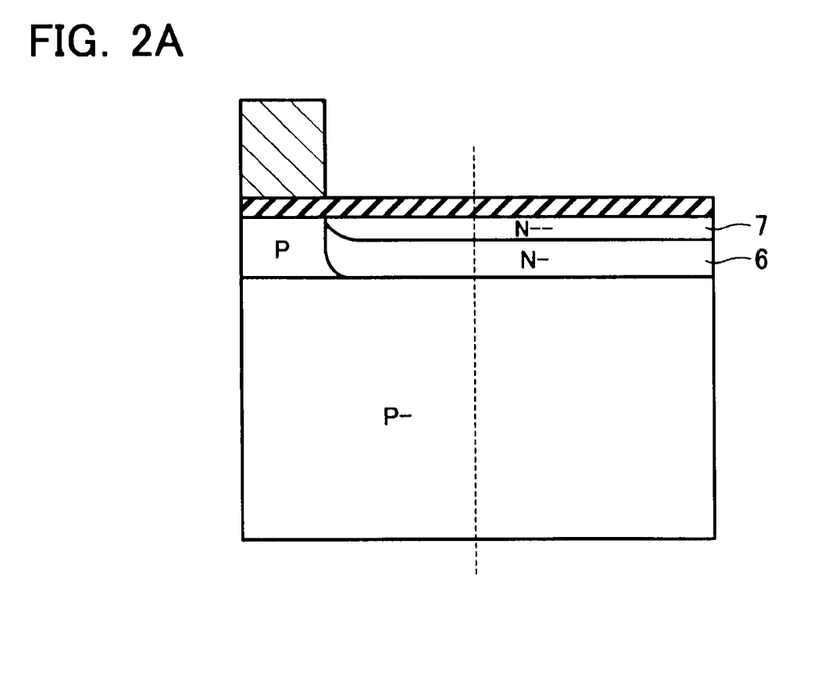
FIG. 2A is an enlarged brief cross-sectional view of a resurf layer portion in the semiconductor device of the first embodiment according to the present invention.
Figure 2B:
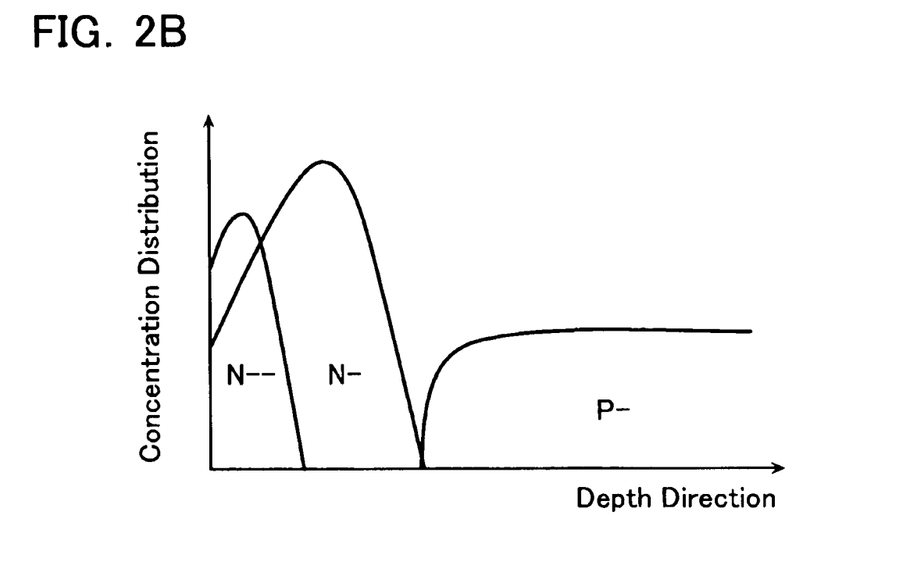
FIG. 2B briefly shows a concentration profile in the resurf layer in the semiconductor device of the first embodiment according to the present invention.

The present embodiment solves the above problem by forming the resurf layers in a double-layered structure with two peak concentrations in depth (the first resurf layer 6 and the second resurf layer 7) and doping the second resurf layer 7 with an impurity at a lower concentration. This is further described with reference to FIG. 2.

FIG. 2A is an enlarged brief diagram of a section near the resurf layers 6, 7 omitting the drain layer 10. FIG. 2B briefly shows an impurity concentration profile in depth in the resurf layers 6, 7. The resurf layers 6, 7 according to the present embodiment are formed through ion implantation in two stages. The first resurf layer 6 is formed through ion implantation, for example, at an acceleration voltage of 100 KeV and an impurity dose of around $1 \times 10^{13}$ cm$^{-2}$. The second resurf layer 7 is formed through ion implantation, for example, at an acceleration voltage of 10 KeV and an impurity dose of around $1 \times 10^{12}$ cm$^{-2}$. In this way, it is made possible to form a profile having two peaks in depth as shown in FIG. 2B by varying the acceleration voltage. Thus, the resurf layer 7 having a lower impurity concentration than the first resurf layer 6 is formed in a surface portion of the P$^-$-type semiconductor layer 2. In addition, the resurf layer 6 having a higher impurity concentration than the second resurf layer 7 is formed in a deeper portion than the surface portion. In accordance with the resurf layers (drift layers) configured with such the concentration profile, the application of a reverse bias across source-drain can deplete a surface portion of the drift layer closest to the end of the gate electrode 3, that is, the second resurf layer 7. Therefore, it is made possible to avoid a high voltage corresponding to the reverse bias to be applied across the gate end and the drift layer. In the LDMOS with the low-breakdown voltage of around 5 V according to the present embodiment, the lateral length of the resurf layers 6, 7 is defined by the width of the sidewall 12. Accordingly, the reliability is retained while the device can be patterned finer. Further, an increase in impurity dose to the first resurf layer 6 can effectively reduce the on-resistance of the device. Furthermore, in accordance with the present embodiment, as described in detail below, the resurf layers 6, 7 can be formed with a mask of the sidewall 12 on the gate electrode 3. Therefore, the flexibility of designing the semiconductor device can be improved without suffering from any influence of the mask misalignment on formation of the resurf layers.

A method of manufacturing the semiconductor device according to the present embodiment is described next. FIGS. 3A-3I illustrate part of processes of manufacturing the semiconductor device according to the present embodiment. For consideration of description, an annealing process is omitted.

Figure 3A:
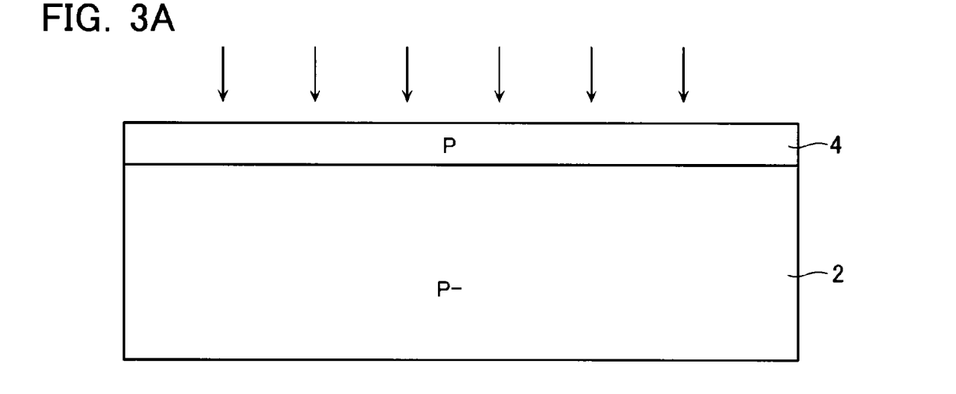
FIG. 3A illustrates a process of manufacturing the semiconductor device of the first embodiment according to the present invention.

First, at step 1, as shown in FIG. 3A, certain ion implantation is performed to the P$^-$-type semiconductor layer 2 to form the channel region 4.

Figure 3B:
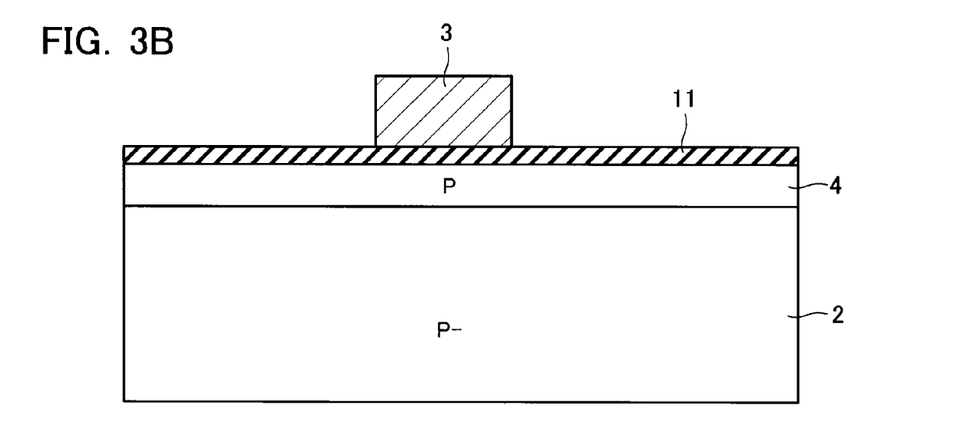
FIG. 3B illustrates a process of manufacturing the semiconductor device of the first embodiment according to the present invention.

Next, at step 2, as shown in FIG. 3B, the insulator (such as silicon oxide) 11 is formed on the surface of the P$^-$-type semiconductor layer 2 (the surface of the channel region 4). Then, photolithography and etching processes are applied to selectively form on the insulator film 11, for example, a polysilicon film to be turned into the gate electrode 3.

Figure 3C:
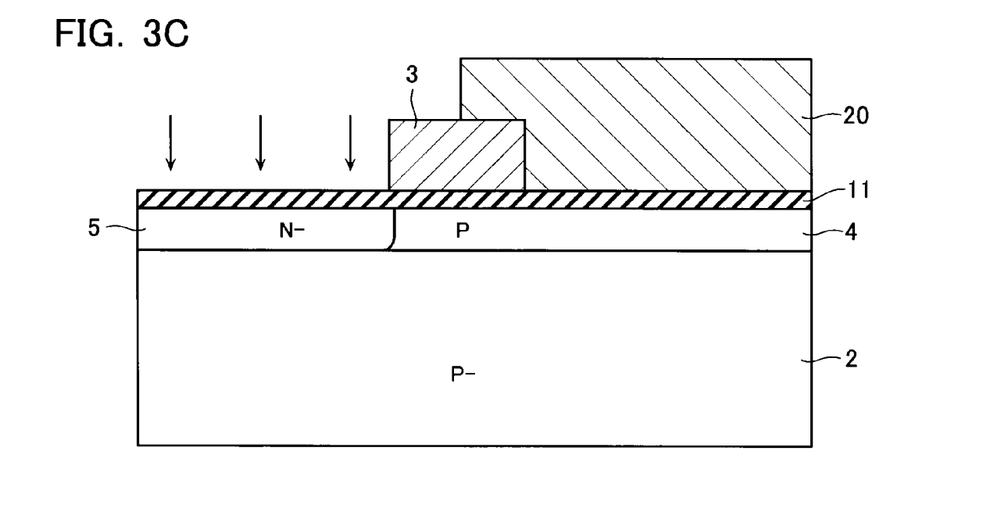
FIG. 3C illustrates a process of manufacturing the semiconductor device of the first embodiment according to the present invention.

Next, at step 3, as shown in FIG. 3C, a photolithography technology is used to form a photoresist 20 having an aperture on the left side (source side) of the gate electrode 3. With a mask of the photoresist 20, ions of, for example, phosphorous (P) are implanted into the substrate at implantation energy of 50-70 KeV and a dose of around $10^{14}$ cm$^{-2}$. The ion implantation is performed in a self-aligned manner with the gate electrode 3 to form the low-concentration N$^-$-type diffused layer or LLD layer 5.

Figure 3D:
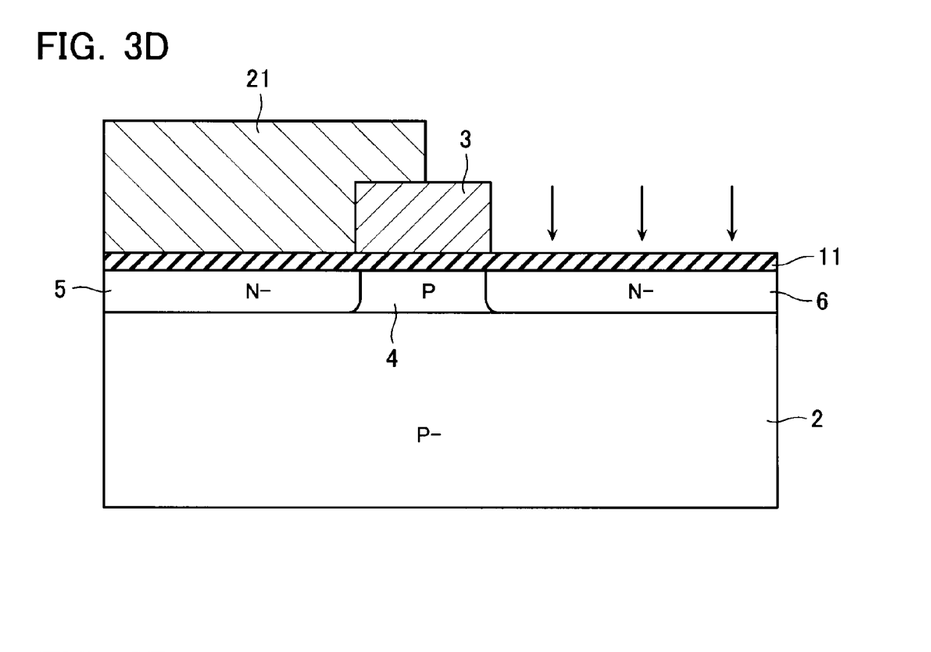
FIG. 3D illustrates a process of manufacturing the semiconductor device of the first embodiment according to the present invention.

Next, at step 4, as shown in FIG. 3D, a photolithography technology is used to form a photoresist 21 having an aperture on the right side (drain side) of the gate electrode 3. With a mask of the photoresist 21, ions of, for example, phosphorous (P) are implanted into the substrate at implantation energy of 50-100 KeV and a dose of around $10^{13}$ cm$^{-2}$. The ion implantation is performed in a self-aligned manner with the gate electrode 3 to form the low-concentration N$^-$-type diffused layer or first resurf layer 6. The acceleration voltage for ion implantation can be adjusted to form the first resurf layer 6 having a concentration profile peak at a desired depth.

Figure 3E:
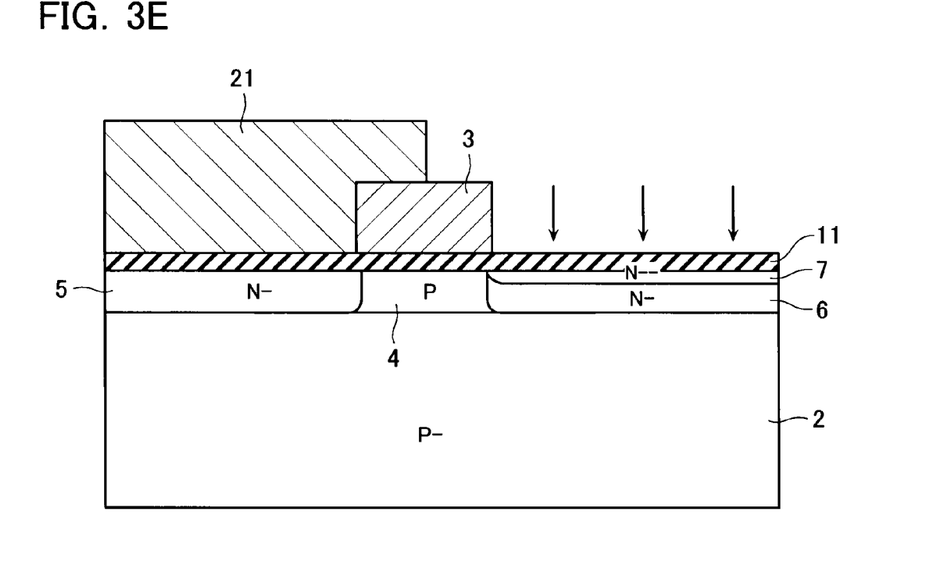
FIG. 3E illustrates a process of manufacturing the semiconductor device of the first embodiment according to the present invention.

Subsequently, at step 5, as shown in FIG. 3E, with a mask of the same photoresist 21, ions of, for example, phosphorous (P) are implanted into the substrate at implantation energy of 5-20 KeV and a dose of around $10^{12}$ cm$^{-2}$. The ion implantation is performed in a self-aligned manner with the gate electrode 3 to form the low-concentration N$^{--}$-type diffused layer or second resurf layer 7. The acceleration voltage for ion implantation can be determined lower than the step of forming the first resurf layer 6 to form the second resurf layer 7 having a concentration profile peak near the surface of the P$^-$-type semiconductor layer 2.

As shown in FIG. 2B, the peak value of the concentration profile in the second resurf layer 7 is smaller than the peak value of the concentration profile in the first resurf layer 6. An actual profile is derived from the sum of design profile concentrations in the first resurf layer 6 and design profile concentrations in the second resurf layer 7. The second resurf layer 7 in the device surface is formed at a lower impurity concentration, thereby depleting the second resurf layer 7, which can retain the breakdown voltage. As a result, a lowered on-resistance and an improved reliability of the gate oxide film can be achieved at the same time.

Figure 3F:
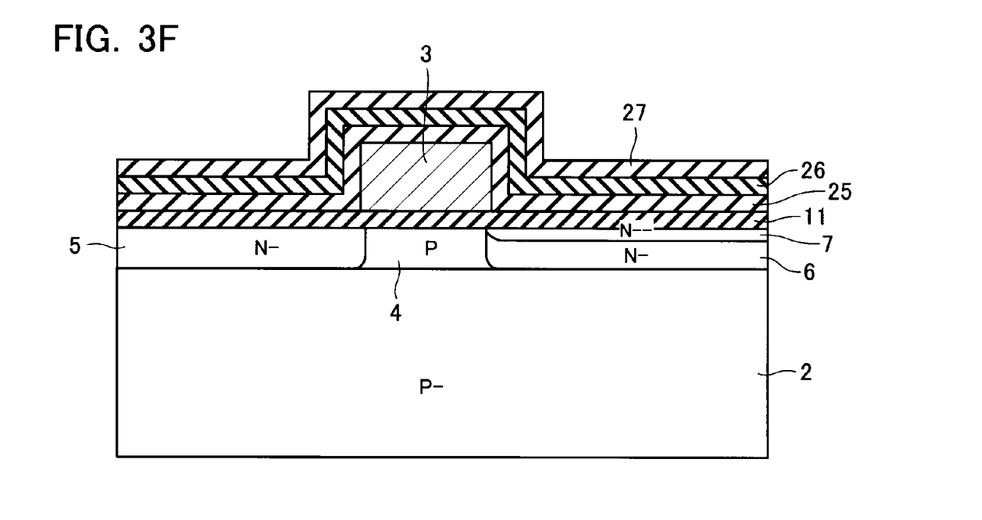
FIG. 3F illustrates a process of manufacturing the semiconductor device of the first embodiment according to the present invention.
Figure 3G:
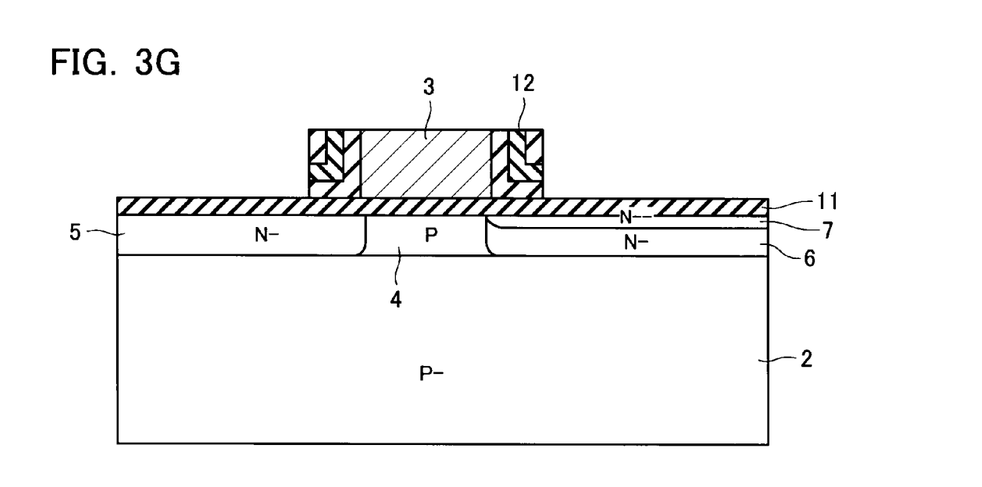
FIG. 3G illustrates a process of manufacturing the semiconductor device of the first embodiment according to the present invention.

Next, at step 6, after removable of the photoresist 21, the sidewall 12 is formed on sides of the gate electrode 3. The sidewall 12 can be formed as follows. First, as shown in FIG. 3F, over the substrate, films of a silicon oxide 25, a silicon nitride 26 and an insulator 27 are deposited in turn. The films can be deposited through a thermal CVD process or a plasma CVD process. The films can be designed to have a desired thickness of several nm to several 100 nm. Next, as shown in FIG. 3G, the silicon oxide 25, the silicon nitride 26 and the insulator 27 are removed by dry etching (anisotropic etching) such as RIE to form the sidewall 12 consequently. The sidewall 12 may not be formed in a triple-layered structure but include two layers or less or four layers or more.

Figure 3H:
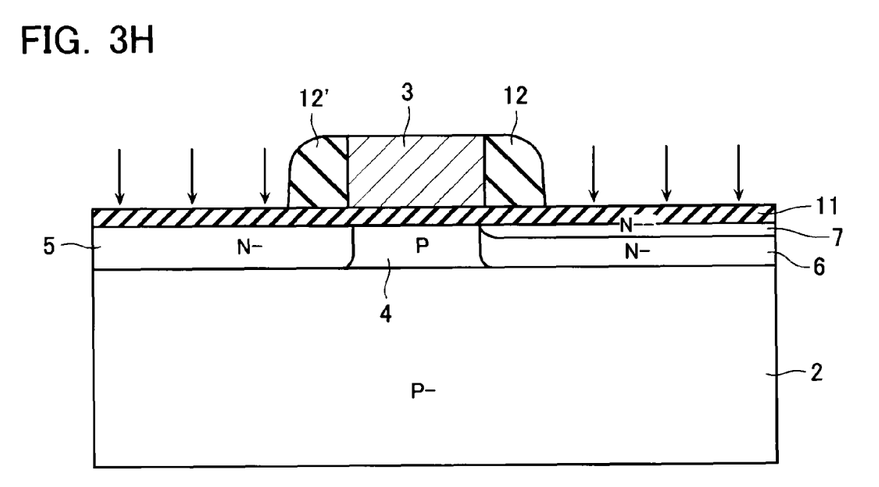
FIG. 3H illustrates a process of manufacturing the semiconductor device of the first embodiment according to the present invention.
Figure 3I:
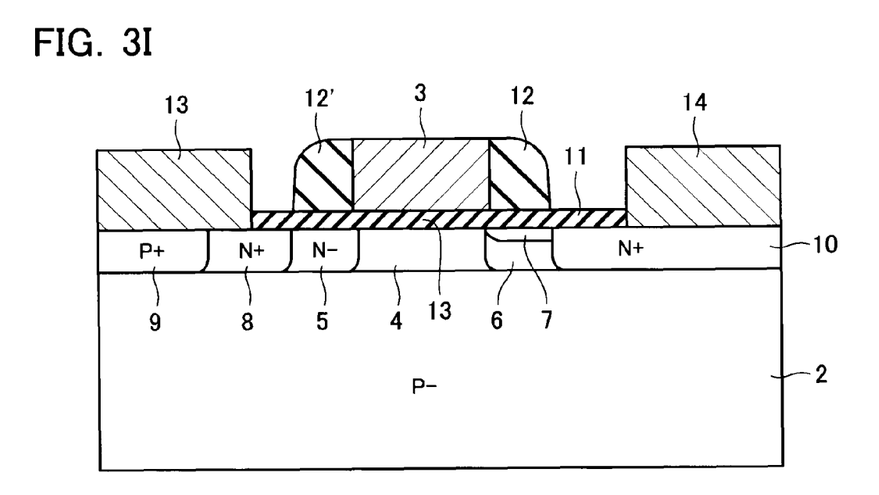
FIG. 3I illustrates a process of manufacturing the semiconductor device of the first embodiment according to the present invention.

Next, at step 7, as shown in FIG. 3H, with a mask of the sidewalls 12, 12', ion implantation is performed in a self-aligned manner to form a high-concentration N$^+$-type diffused layer, using an n+dopant, for example, arsenic (As). In that case, ion implantation is performed under such condition as, at 30-60 KeV, and an ion concentration of $2.0 \times 10^{15}$ cm$^{-2}$ to $5.0 \times 10^{15}$ cm$^{-2}$ to form the N$^+$-type source layer 8 and the N$^+$-type drain layer 10 at the same time.

The lateral length of the sidewall 12 is defined by the sum of thicknesses of the insulators 25, 26, 27, which may be 0.1-0.2 μm. In the present invention, the sidewall 12 can be used as a mask to form the resurf layers 6, 7 beneath the sidewall 12. The lateral length of the resurf layers 6, 7 can be designed as the lateral length of the sidewall 12, that is, the sum of thicknesses of the insulators 25, 26, 27. The use of the sidewall 12 as a mask in this way prevents mask alignments from causing positional displacements and improves the flexibility of designing fine-patterned LDMOS transistors without the need for taking a design margin of mask misalignment into account.

Subsequently, at step 8, as shown in FIG. 1, a photoresist formed by a photolithography technology is used as a mask to form the P$^+$-type contact layer 9, using a P$^+$ dopant, for example, boron (B) or BF$_2$. In that case, ion implantation is performed under such condition as, at 2.0-4.0 KeV, and an ion concentration of $2.0 \times 10^{14}$ cm$^{-2}$ to $5.0 \times 10^{15}$ cm$^{-2}$. Finally, contact holes are opened through the insulator film 11, and then photolithography and etching processes are applied to form the source electrode 15 on the source layer 8 and the contact layer 9 in common, and the drain electrode 14 on the drain layer.

In accordance with the present embodiment, part of the resurf layer, that is, the device surface is depleted. This makes it possible to improve the reliability of the gate oxide film and realize fine pattering of the device and a lower on-resistance at the same time. In addition, the sidewall is used as a mask to form the resurf layer. This is effective to improve the flexibility of designing.

Second Embodiment

Figure 4:
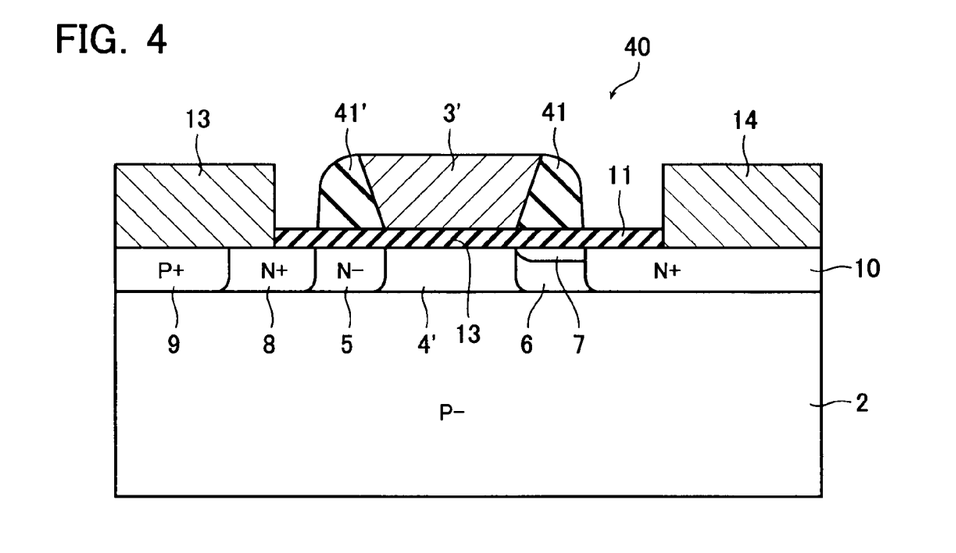
FIG. 4 briefly shows a structural cross-sectional view of a semiconductor device of a second embodiment according to the present invention.

FIG. 4 is a cross-sectional view showing a second embodiment associated with the semiconductor device according to the present invention. The LDMOS transistor 40 according to the present embodiment has the same configuration as the first embodiment except the shapes of a gate electrode 3', sidewalls 41, 41' and a channel region 4'.

As shown in FIG. 4, in the second embodiment the gate electrode 3' has sides, which are formed symmetrically oblique such that the gate electrode is tapered downward from above. Therefore, the top of the gate electrode 3' has a longer lateral length than the lateral length of the bottom. The sidewalls 41, 41' have respective sides facing the gate electrode 3', which are similarly formed oblique along the oblique sides of the gate electrode 3'. Therefore, the top of the sidewall 41, 41' has a shorter lateral length than the lateral length of the bottom. The sidewall 41 is used as a mask to form the resurf layers 6, 7 beneath the sidewall 41. The channel region 4' is formed shorter than the channel region 4 in the first embodiment.

In accordance with the second embodiment, it is made possible to ensure the lateral length of the resurf layer and shorten the length of the channel 4. This makes it possible to achieve an improvement in reliability and fast switching at the same time.

Third Embodiment

Figure 5:
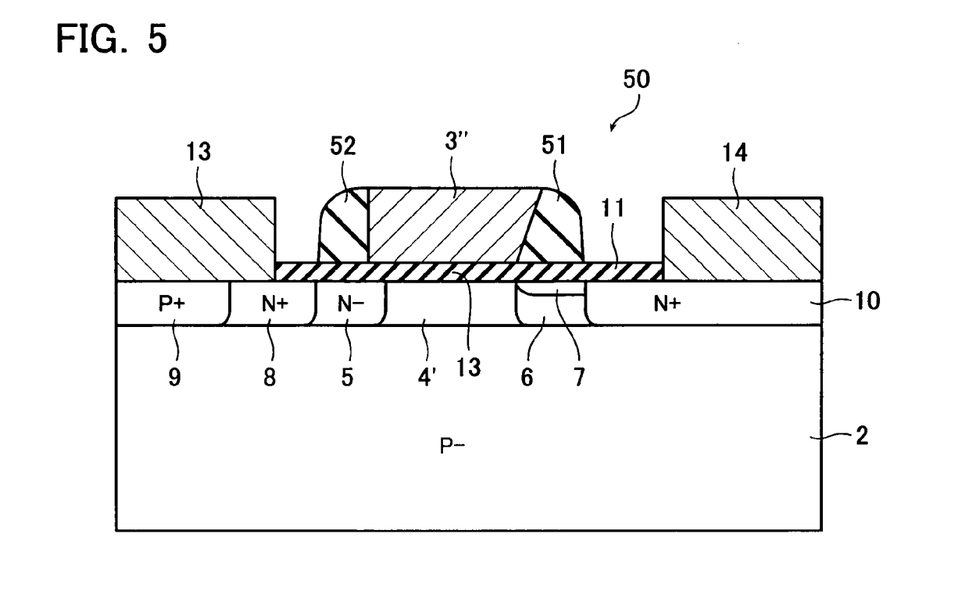
FIG. 5 briefly shows a structural cross-sectional view of a semiconductor device of a third embodiment according to the present invention.

FIG. 5 is a cross-sectional view showing a third embodiment associated with the semiconductor device according to the present invention. The LDMOS transistor 50 according to the present embodiment has the same configuration as the first embodiment except the shapes of a gate electrode 3", sidewalls 51, 52 and a channel region 4".

In the third embodiment the gate electrode 3" has sides, only one (drain side) of which is formed oblique. The top of the gate electrode 3" has a longer lateral length than the lateral length of the bottom. The sidewall 51 has a side facing the gate electrode 3", which is similarly formed oblique along the oblique side of the gate electrode 3". Therefore, the top of the sidewall 51 has a shorter lateral length than the lateral length of the bottom. On the other hand, the top of the sidewall 52 on the source side is formed thinner than the sidewall 12' in the first embodiment. The sidewall 51 is used as a mask to form the resurf layers 6, 7 in the P$^-$-type semiconductor layer region beneath the sidewall 51. The channel region 4' is formed shorter than the channel region 4 in the first embodiment.

In accordance with the third embodiment, it is made possible to ensure the lateral length of the resurf layer and shorten the length of the channel 4. This makes it possible to achieve an improvement in reliability and fast switching at the same time.

Others

The embodiments of the invention have been described above though the present invention is not limited these but rather can be given various modifications, additions and so forth without departing from the scope and spirit of the invention. For example, the concentration profiles in FIG. 2B show the example of ion implantation executed twice though they may be formed through ion implantation executed three times or more. It is also possible to form a desirable profile through ion implantation executed once.

In FIG. 1, a sufficiently high concentration in the P$^-$-type semiconductor layer 2 eliminates the need for forming the channel region 4 separately. Further, the channel region 4 may be formed to the middle of the region below the gate electrode 3.

What is claimed is:

1. A semiconductor device, comprising:
    a LDMOS transistor, the LDMOS transistor comprising:
        a semiconductor layer of a first conduction type;
        a gate electrode formed on said semiconductor layer via an insulator layer;
        a sidewall insulator film formed on sides of said gate electrode;
        an LDD layer of a second conduction type located in the surface of said semiconductor layer beneath said sidewall insulator film;
        a source layer of the second conduction type formed in the surface of said semiconductor layer at a position adjacent to said LDD layer;
        a resurf layer of the second conduction type formed in the surface of said semiconductor layer at a position sandwiching said gate electrode with said LDD layer, said resurf layer formed under said sidewall insulator film; and
        a drain layer of the second conduction type formed in the surface of said semiconductor layer at a position adjacent to said resurf layer,
        wherein said resurf layer includes a first resurf layer having a peak of a first impurity concentration and a second resurf layer formed below the first resurf layer and having a peak of a second impurity concentration,
        wherein said peak of said first impurity concentration is smaller than said peak of said second impurity concentration, and
    the cross-section of the second resurf layer in a plane perpendicular to the surface of said semiconductor layer is larger than that of the first resurf layer in a plane perpendicular to the surface of said semiconductor layer.

2. The semiconductor device according to claim 1, wherein said resurf layer is formed through ion implantation executed multiple times.

3. The semiconductor device according to claim 1, wherein said resurf layer is formed through ion implantation executed multiple times at different acceleration voltages.

4. The semiconductor device according to claim 1, wherein said gate electrode has sides, which are formed oblique such that said gate electrode is tapered downward from above.

5. The semiconductor device according to claim 4, wherein said resurf layer is formed through ion implantation executed multiple times.

6. The semiconductor device according to claim 1, wherein said gate electrode has sides, at least one of which is formed oblique to the surface of said semiconductor layer, wherein said gate electrode has a longer lateral length at the upper surface than at the lower surface.

* * * * *